United States Patent
Takeuchi

(10) Patent No.: US 11,632,082 B2
(45) Date of Patent: Apr. 18, 2023

(54) SEMICONDUCTOR INTEGRATED CIRCUIT AND RECEIVER

(71) Applicant: Kioxia Corporation, Tokyo (JP)

(72) Inventor: Tomohiko Takeuchi, Funabashi (JP)

(73) Assignee: Kioxia Corporation, Tokyo (JP)

( * ) Notice: Subject to any disclaimer, the term of this patent is extended or adjusted under 35 U.S.C. 154(b) by 301 days.

(21) Appl. No.: 17/018,110

(22) Filed: Sep. 11, 2020

(65) Prior Publication Data

US 2021/0305941 A1 Sep. 30, 2021

(30) Foreign Application Priority Data

Mar. 25, 2020 (JP) .............................. JP2020-053683

(51) Int. Cl.
| | | |
|---|---|---|
| H03F 1/02 | (2006.01) | |
| H04L 25/03 | (2006.01) | |
| H04B 1/16 | (2006.01) | |
| H03F 3/195 | (2006.01) | |

(52) U.S. Cl.
CPC ........... *H03F 1/0216* (2013.01); *H03F 3/195* (2013.01); *H04B 1/1607* (2013.01); *H04L 25/03878* (2013.01)

(58) Field of Classification Search
CPC .... H03F 1/0216; H03F 3/195; H03F 3/45183; H03F 3/45511; H03F 2200/451; H03F 2203/45418; H03F 2203/45424; H04B 1/1607; H04L 25/03878; H04L 25/0272; H04L 25/03885; H04L 25/03146
See application file for complete search history.

(56) References Cited

U.S. PATENT DOCUMENTS

| | | | |
|---|---|---|---|
| 7,301,533 B2* | 11/2007 | Shin | H03K 19/0013 345/204 |
| 9,313,054 B1 | 4/2016 | Liao et al. | |
| 9,722,819 B2 | 8/2017 | Akita et al. | |
| 10,263,815 B1* | 4/2019 | Geary | H04L 25/03885 |
| 10,637,695 B1* | 4/2020 | Venkatesan | H04L 25/0278 |
| 2005/0007150 A1* | 1/2005 | Omote | H04L 25/028 326/83 |
| 2020/0312264 A1* | 10/2020 | Tsuchi | G09G 3/3688 |

FOREIGN PATENT DOCUMENTS

| | | |
|---|---|---|
| JP | 2015-216613 A | 12/2015 |
| JP | 2018-511207 A | 4/2018 |
| JP | 2019-146141 A | 8/2019 |

* cited by examiner

*Primary Examiner* — Jean B Corrielus
(74) *Attorney, Agent, or Firm* — Oblon, McClelland, Maier & Neustadt, L.L.P.

(57) ABSTRACT

According to one embodiment, a semiconductor integrated circuit includes first and second power supply lines, first and second nodes, and first and second circuits. The first circuit is configured to supply a first current to the second power supply line, from the first node or the second node. The second circuit is configured to supply a second current from the first power supply line to the first node based on a magnitude of the first current, and to supply a third current from the first power supply line to the second node based on the magnitude of the first current.

20 Claims, 13 Drawing Sheets

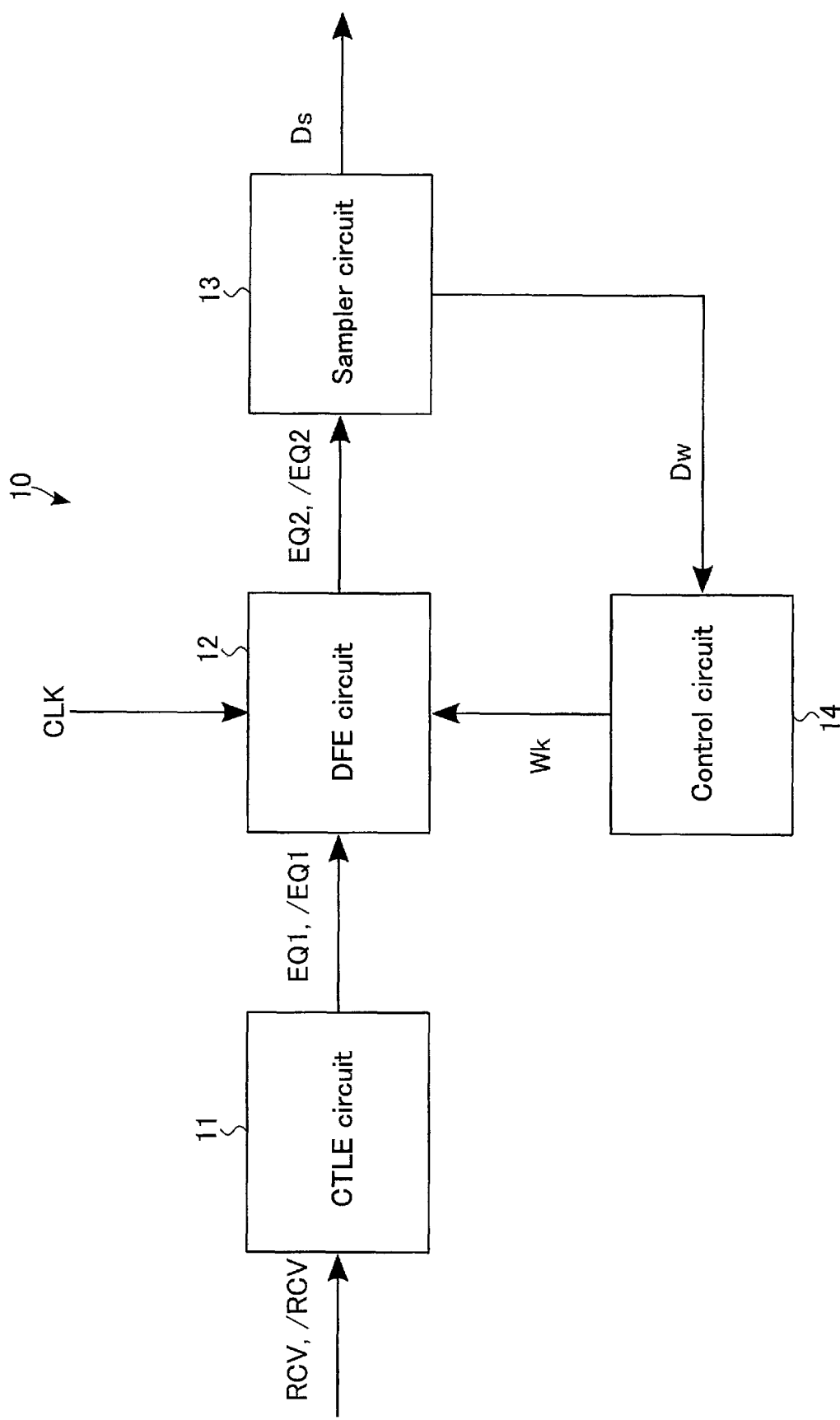
F I G. 2

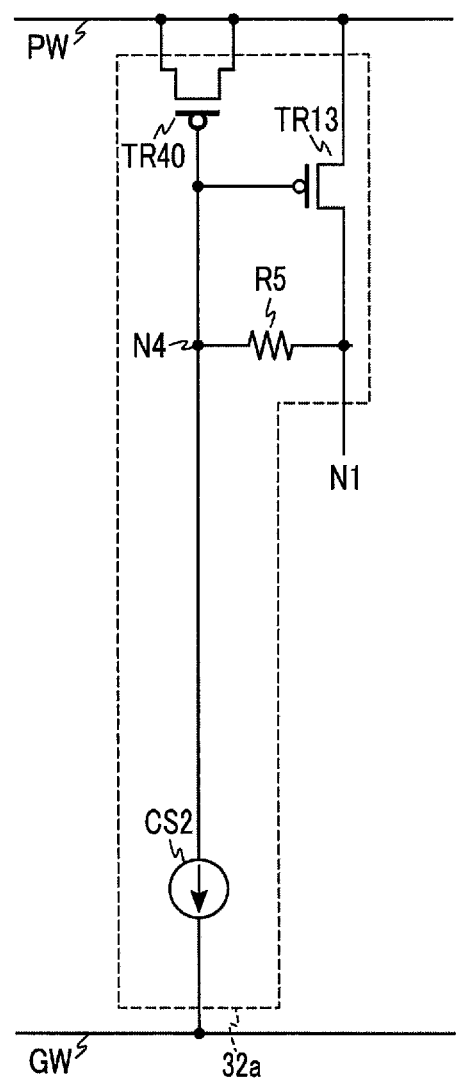
F I G. 13

SEMICONDUCTOR INTEGRATED CIRCUIT AND RECEIVER

CROSS-REFERENCE TO RELATED APPLICATIONS

This application is based upon and claims the benefit of priority from Japanese Patent Application No. 2020-053683, filed Mar. 25, 2020, the entire contents of which are incorporated herein by reference.

FIELD

Embodiments described herein relate generally to a semiconductor integrated circuit and a receiver.

BACKGROUND

Semiconductor integrated circuits that implement an equalization process for compensating a loss incurred by a transmission characteristic of a transmission line have been known.

BRIEF DESCRIPTION OF THE DRAWINGS

FIG. 2 is a block diagram showing an exemplary structure of the semiconductor integrated circuit according to the present embodiment.

FIG. 13 is a circuit diagram showing an exemplary structure of an active inductor load circuit in a fifth modification example of the embodiment.

DETAILED DESCRIPTION

Figure 1:
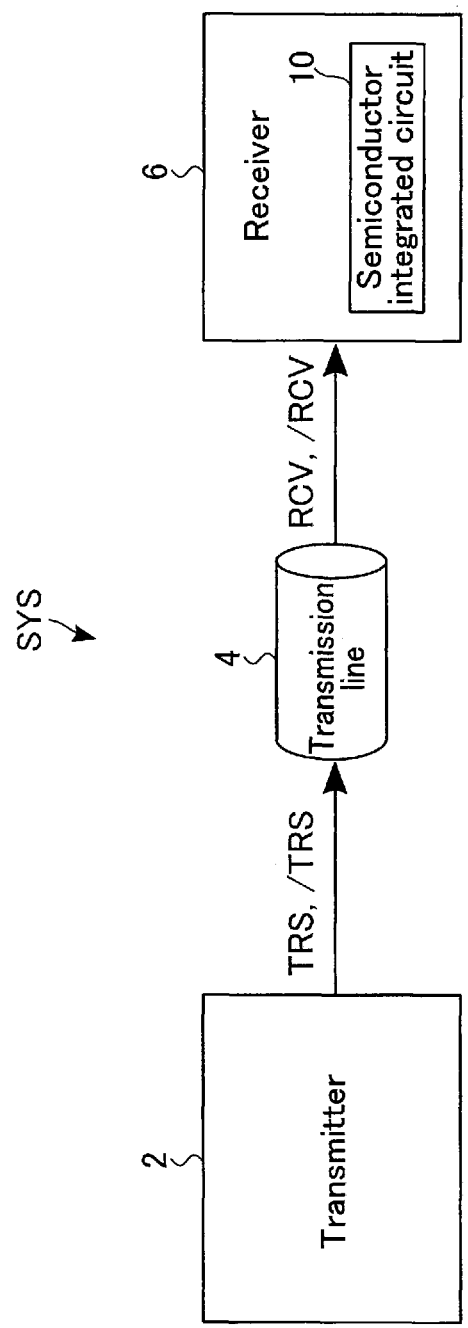
FIG. 1 is a block diagram showing an exemplary structure of a system including a semiconductor integrated circuit according to a present embodiment.

In general, according to one embodiment, a semiconductor integrated circuit includes a first power supply line, a second power supply line, a first node, a second node, a first circuit, and a second circuit. A first voltage is applied to the first power supply line. A second voltage is applied to the second power supply line. The second voltage is lower than the first voltage. The first node is arranged between the first power supply line and the second power supply line. The first node is configured to output, based on first differential signals input to the semiconductor integrated circuit, one of second differential signals. The second node is arranged between the first power supply line and the second power supply line. The second node is configured to output the other of the second differential signals. The first circuit includes a first transistor and a second transistor. The first transistor includes a first end coupled to the first node and a gate to which a first control signal is input. The second transistor includes a first end coupled to the second node and a gate to which an inverted signal of the first control signal is input. A second end of the first transistor and a second end of the second transistor both are electrically coupled to the second power supply line. The first circuit is configured to supply a first current to the second power supply line, from the first node via the first transistor or from the second node via the second transistor. A second circuit includes a third transistor and a fourth transistor. The third transistor includes a first end coupled to the first node and a second end coupled to the first power supply line. The fourth transistor includes a first end coupled to the second node and a second end coupled to the first power supply line. The second circuit is configured to supply a second current from the first power supply line to the first node via the third transistor based on a magnitude of the first current, and to supply a third current from the first power supply line to the second node via the fourth transistor based on the magnitude of the first current.

The embodiments will be described with reference to the drawings. Each of the embodiments illustrates a device or method that embodies the technical concept of the invention. The drawings are presented to show schematic or conceptual structures, and therefore the dimensions and ratio on the drawings may not be identical to the actual dimensions and ratio. The technical concept of the invention is not limited by the shape, structure, arrangement and the like of the structural components.

Throughout the description, the same reference symbols are assigned to structural components having approximately the same functions and structures. The reference symbols may include characters and numerals that follow the characters, and the numerals in the reference symbols containing the same characters are employed to distinguish components of the same structure from each other. When the components of the reference symbols containing the same characters need not be particularly distinguished from each other, these components may be referred to with the reference symbols containing the characters only.

In the description, signals having a name starting with "/" indicate inverted signals.

EMBODIMENTS

A semiconductor integrated circuit 10 according to the present embodiment is an equalizer circuit. The semiconductor integrated circuit 10 according to the present embodiment will be described below.

[1] Structure of Semiconductor Integrated Circuit 10

[1-1] Entire Structure of System SYS Including the Semiconductor Integrated Circuit 10

FIG. 1 shows an exemplary structure of a system SYS including the semiconductor integrated circuit 10 according to the present embodiment. The system SYS transmits data from a transmitter to a receiver through high-speed serial communication. The system SYS may conform to, for example, the standards of the PCI express (trademark). As illustrated in FIG. 1, the system SYS includes a transmitter 2, a transmission line 4, and a receiver 6.

The transmitter 2 transmits signals TRS and /TRS to the receiver 6 through the transmission line 4. The signals TRS and /TRS may be pulse signals having a digital value "0" or "1" that can be identified in each of consecutive time points (segments). The transmitter 2 transmits information encoded as the pulse signals to the receiver 6 through the transmission line 4.

The transmission line 4 is a structural or spatial transmission medium for transmitting the signals TRS and /TRS to the receiver 6. The transmission line 4 may couple the transmitter 2 to the receiver 6, and may be a wired line including wirings on the PCB or cables, or a wireless line. The transmission line 4 may have transmission characteristics corresponding to the physical structure and material of the transmission medium. The transmission characteristics may include frequency characteristics that demonstrate a loss of a gain in a specific frequency range. If a loss is produced in a signal due to the transmission characteristics of the transmission line 4, intersymbol interference (ISI) may be incurred. ISI is a phenomenon in which waveforms interfere between adjacent segments, which are each supposed to have individual data. Once the ISI occurs, the possibility of errors may increase when the receiver restores the data. Here, the signals TRS and /TRS that suffer a loss due to the transmission characteristics of the transmission line 4 will be referred to as signals RCV and /RCV, respectively. The signals RCV and /RCV are input to the receiver 6. The signals TRS and /TRS form a pair of differential signals, and signals RCV and /RCV also form a pair of differential signals.

The receiver 6 receives the signals RCV and /RCV, and based on these signals RCV and /RCV, restores the information contained in the signals TRS and /TRS. The receiver 6 includes the semiconductor integrated circuit 10. The semiconductor integrated circuit 10 compensates the loss incurred by the transmission characteristics of the transmission line 4. In other words, the semiconductor integrated circuit 10 suppresses the influence of the ISI. Through the restoration of the data using the signals compensated by the semiconductor integrated circuit 10, the receiver 6 suppresses the increase of errors.

[1-2] Structure of Semiconductor Integrated Circuit 10

FIG. 2 shows an exemplary structure of the semiconductor integrated circuit 10 according to the first embodiment. As illustrated in FIG. 2, the semiconductor integrated circuit 10 includes a CTLE circuit 11, a DFE circuit 12, a sampler circuit 13, and a control circuit 14.

The CTLE circuit 11 may include a continuous time linear equalizer. The CTLE circuit 11 receives signals RCV and /RCV, and executes a linear equalization process thereon to amplify gains of the signals RCV and /RCV in high frequency range, thereby generates signals EQ1 and /EQ1. Thereafter, the CTLE circuit 11 transmits the generated signals EQ1 and /EQ1 to the DFE circuit 12.

The DFE circuit 12 may be a decision feedback equalizer or any other non-linear equalizer. The DFE circuit 12 operates at timings based on clock CLK. The DFE circuit 12 receives signals EQ1 and /EQ1 as input signals from the CTLE circuit 11. The DFE circuit 12 determines, based on the clock CLK, whether digital value of each of these input signals is "0" or "1", and thereby generates determination signals. The DFE circuit 12 updates the determination signals at timings in accordance with the clock CLK, and stores a plurality of determination signals, which include the last updated determination signals to determination signals updated n times before. The DFE circuit 12 has a functional structure for executing a non-linear equalization process for example, based on a specific tap coefficient Wk, for feeding a signal based on the determination signals back to the input signals. The tap coefficient Wk may be input from the control circuit 14. The tap coefficient Wk corresponds to determination signal updated k times before. The value k is an integer of 1 or greater and n or smaller, and n is a natural number.

In particular, the DFE circuit 12 adds, to the signals EQ1 and /EQ1, feedback signals generated by multiplying the determination signals by the tap coefficient Wk, thereby generates signals EQ2 and /EQ2. The DFE circuit 12 transmits the signals EQ2 and /EQ2 to the sampler circuit 13. The signals EQ1 and /EQ1 form a pair of differential signals, and similarly, the signals EQ2 and /EQ2 form a pair of differential signals.

The sampler circuit 13 determines the data included in the signals EQ2 and /EQ2 equalized by the CTLE circuit 11 and DFE circuit 12, and generates a sampling result Ds. In this manner, the semiconductor integrated circuit 10 reads a sampling result Ds as data estimated as corresponding to the signals TRS and /TRS. The sampler circuit 13 may adopt as a reference voltage an intermediate value of the amplitudes of the differential signal of the signals EQ2 and /EQ2, and determine the data included in the signals EQ2 and /EQ2 based on whether or not the differential signal is greater than the reference voltage. The sampler circuit 13 also determines whether or not the signals EQ2 and /EQ2 are accurately equalized, and transmits information Dw that represents the determination result regarding the equalization, to the control circuit 14.

The control circuit 14 controls operations of the DFE circuit 12. Specifically, the control circuit 14 receives the information Dw from the sampler circuit 13, and transmits the tap coefficient Wk to the DFE circuit 12 based on the information Dw. [1-3] Structure of DFE circuit 12

Figure 3:
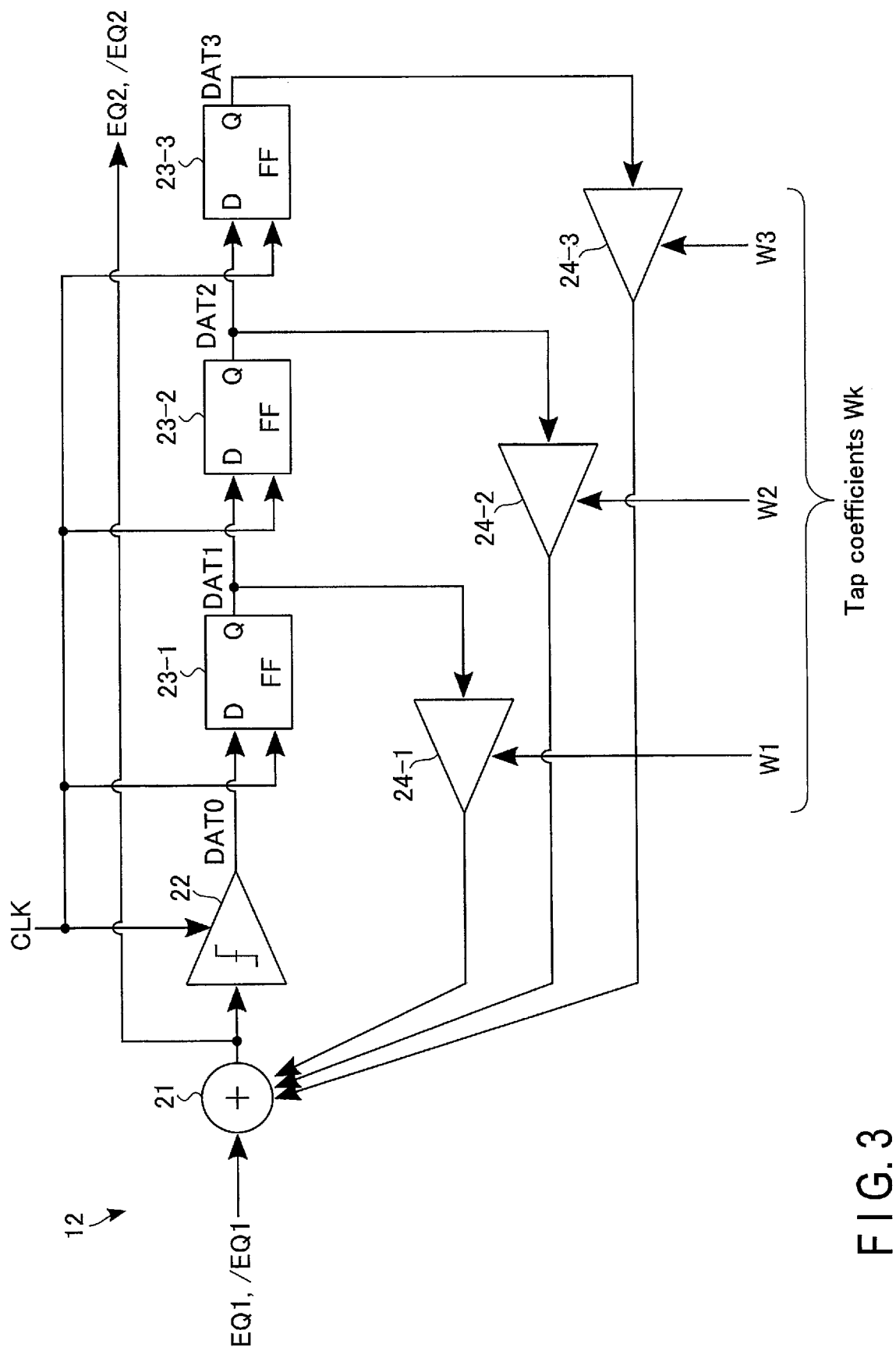
FIG. 3 is a block diagram showing an exemplary structure of a DFE circuit according to the present embodiment.

FIG. 3 shows an exemplary functional structure of the DFE circuit 12 in the semiconductor integrated circuit 10 according to the present embodiment. For the sake of simplicity, it is assumed in the illustration of FIG. 3 and subsequent drawings that the determination signals referred to by the DFE circuit 12 include the last updated determination signal to determination signal updated three times before, or in other words, n=3. As illustrated in FIG. 3, the DFE circuit 12 includes an adder 21, a decision circuit 22, flip-flop circuits 23-1, 23-2 and 23-3, and buffer circuits 24-1, 24-2 and 24-3.

The adder 21 adds to the signals EQ1 and /EQ1 the feedback signals obtained from the buffer circuits 24-1, 24-2 and 24-3, and transmits the resultant signals EQ2 and /EQ2 to the decision circuit 22. The adder 21 also transmits the signals EQ2 and /EQ2 to the outside of the DFE circuit 12, for example to the sampler circuit 13.

Upon the receipt of the signals EQ2 and /EQ2 from the adder 21, the decision circuit 22 determines whether the data values indicated by these signals are "0" or "1", thereby generates a digital value DAT0 corresponding to the determination result. A timing of determining the signals is determined based on the clock CLK input to the decision circuit 22. The decision circuit 22 transmits the generated digital value DAT0 to the flip-flop circuit 23-1.

The flip-flop circuits 23-1, 23-2 and 23-3 are coupled in series. In particular, output of the flip-flop circuit 23-1 is coupled to input of the flip-flop circuit 23-2. Output of the flip-flop circuit 23-2 is coupled to input of the flip-flop circuit 23-3. Each of the flip-flop circuits 23-1, 23-2 and 23-3 updates stored digital value to the input digital value in accordance with the clock CLK.

For instance, the flip-flop circuits 23-1, 23-2 and 23-3 store digital values based on the determination signals of the last update, second to last update, and third to last update, respectively. The flip-flop circuit 23-1 outputs stored digital value DAT1 to the buffer circuit 24-1. The flip-flop circuit 23-2 outputs stored digital value DAT2 to the buffer circuit 24-2. The flip-flop circuit 23-3 outputs stored digital value DAT3 to the buffer circuit 24-3.

In the buffer circuits 24-1, 24-2 and 24-3, corresponding tap coefficients W1, W2 and W3 are set. The buffer circuits 24-1, 24-2 and 24-3 generate feedback signals by multiplying the input digital values by the tap coefficients W1, W2 and W3, respectively, and transmit the generated feedback signals to the adder 21.

In the following description, the signal fed back to the input signal based on the digital value DATk corresponding to the k-th last updated determination signal and the tap coefficient Wk will be referred to as a "feedback signal of the k-th tap". For instance, feedback signal generated based on the digital value DAT1 corresponding to the last updated determination signal and the tap coefficient W1 will be referred to as "the feedback signal of the first tap".

Figure 4:
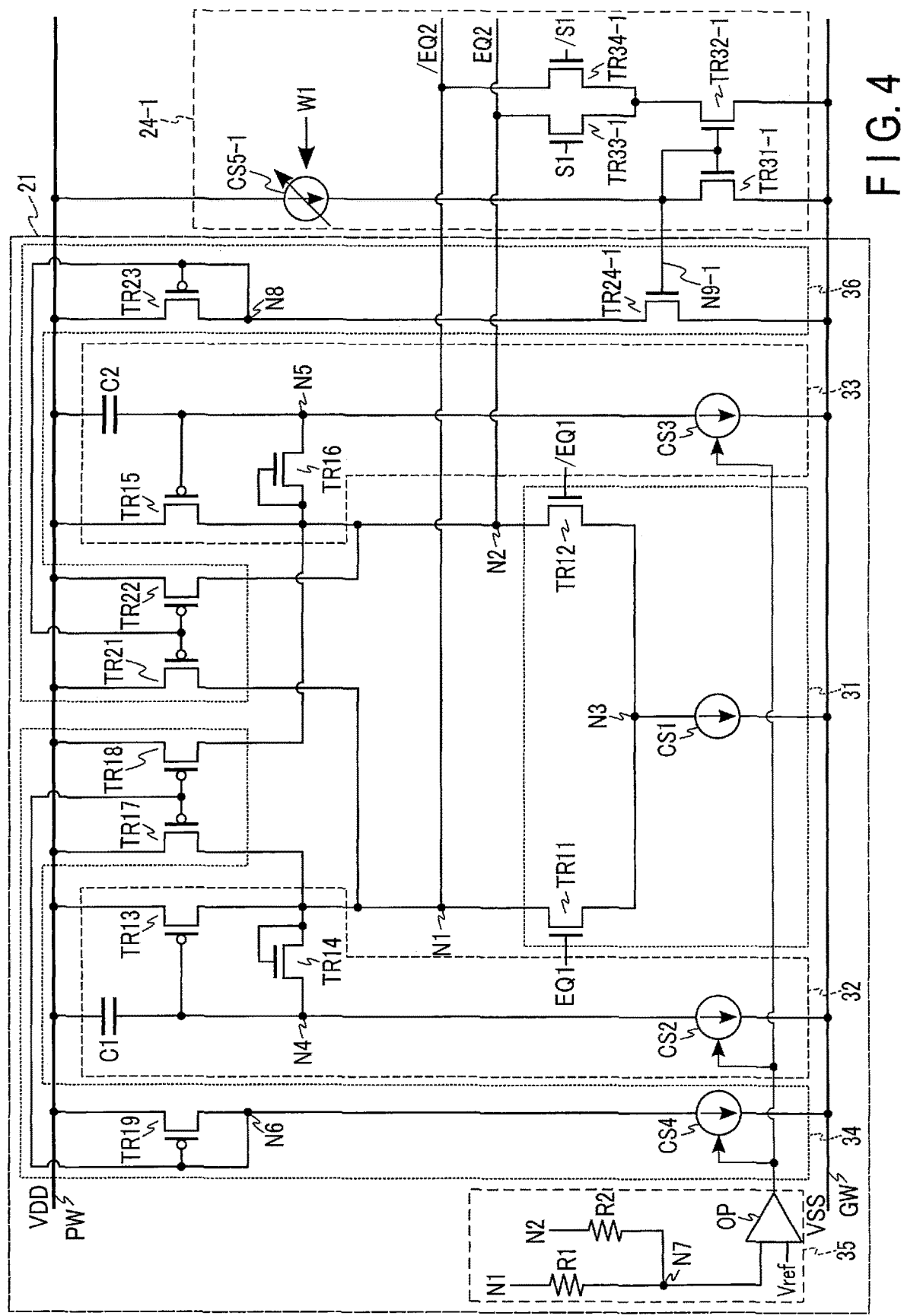
FIG. 4 is a circuit diagram showing an exemplary structure of the DFE circuit according to the present embodiment.

FIG. 4 shows an exemplary circuit structure of the adder 21 and buffer circuit 24-1 in the DFE circuit 12 of the semiconductor integrated circuit 10 according to the present embodiment. In the example of FIG. 4, the adder 21 is a differential amplification circuit, to which the signals EQ1 and /EQ1 are input, and the adder 21 thereby outputs the signals EQ2 and /EQ2. Furthermore, signals S1 and /S1 are input to the buffer circuit 24, and the buffer circuit 24 pulls the current from the output of the adder 21, or in other words, the output of the differential amplification circuit to perform feedback. A power supply voltage VDD is applied to the power supply line PW, while a power supply voltage VSS is applied to the ground line GW. The power supply voltage VDD is higher than the power supply voltage VSS. In the example of FIG. 4, only the circuit corresponding to the first of the three taps in the DFE circuit 12 is illustrated. The structure relating to the second and third taps will be described later.

As illustrated in FIG. 4, the adder 21 includes a differential pair 31, active inductor load circuits 32 and 33, a constant current load circuit 34, a common mode feedback (CMFB) circuit 35, and a current injection circuit 36.

The differential pair 31 amplifies the differential between the signals EQ1 and /EQ1. The differential pair 31 may include transistors TR11 and TR12 and a current source CS1. The transistors TR11 and TR12 may be n-type MOSFETs.

The signal EQ1 is applied to the gate of the transistor TR11, and the drain of the transistor TR11 is coupled to the node N1. The signal /EQ1 is applied to the gate of the transistor TR12, and the drain of the transistor TR12 is coupled to the node N2. The source of the transistor TR11 and the source of the transistor TR12 are commonly coupled to the node N3. The current source CS1 is coupled between the node N3 and ground line GW so as to supply the current from the node N3 to the ground line GW.

Each of the active inductor load circuits 32 and 33 and constant current load circuit 34 functions as a load of the differential pair 31. In particular, each of the active inductor load circuits 32 and 33 and constant current load circuit 34 operates as a load impedance to the differential pair 31. The differential pair 31 uses this load impedance to amplify the signal.

The active inductor load circuit 32 may include transistors TR13 and TR14, a capacitor C1 and a current source CS2. The transistor TR13 may be a p-type MOSFET, and the transistor TR14 may be an n-type MOSFET.

The source of the transistor TR13 is coupled to the power supply line PW, and the drain of the transistor TR13 is coupled to the node N1. The gate and drain of the transistor TR14 are commonly coupled to the node N1. One electrode of the capacitor C1 is coupled to the power supply line PW. The gate of the transistor TR13, the source of the transistor TR14 and the other electrode of the capacitor C1 are commonly coupled to the node N4. The current source CS2 is coupled between the node N4 and ground line GW so as to supply the current from the node N4 to the ground line GW.

For the sake of explanation, the transconductance of the transistor TR13 is denoted as gmP13, the transconductance of the transistor TR14 is denoted as gmN14, and the capacity of the capacitor C1 is denoted as CAP1. With these denotations, the impedance of the active inductor load circuit 32 to the differential pair 31 can be expressed as (CAP1/(gmP13×gmN14))+(1/gmP13). That is, the active inductor load circuit 32 operates as an inductive load with respect to the differential pair 31.

The active inductor load circuit 33 includes transistors TR15 and TR16, a capacitor C2, and a current source CS3. The transistor TR15 may be a p-type MOSFET, and the transistor TR16 may be an n-type MOSFET.

The source of the transistor TR15 is coupled to the power supply line PW, and the drain of the transistor TR15 is coupled to the node N2. The gate and drain of the transistor TR16 are commonly coupled to the node N2. One electrode of the capacitor C2 is coupled to the power supply line PW. The gate of the transistor TR15, the source of the transistor TR16 and the other electrode of the capacitor C2 are commonly coupled to the node N5. The current source CS3 is coupled between the node N5 and ground line GW so as to supply the current from the node N5 to the ground line GW.

For the sake of explanation, the transconductance of the transistor TR15 is denoted as gmP15, the transconductance of the transistor TR16 is denoted as gmN16, and the capacitance of the capacitor C2 is denoted as CAP2. With these denotations, the impedance of the active inductor load circuit 33 to the differential pair 31 can be expressed as (CAP2/(gmP15×gmN16))+(1/gmP15). That is, the active inductor load circuit 33 may operate as an inductive load with respect to the differential pair 31.

The constant current load circuit 34 includes transistors TR17, TR18 and TR19, and a current source CS4. Each of the transistors TR17, TR18 and TR19 may be a p-type MOSFET.

The source of the transistor TR17 is coupled to the power supply line PW, and the drain of the transistor TR17 is coupled to the node N1. The source of the transistor TR18 is coupled to the power supply line PW, and the drain of the transistor TR18 is coupled to the node N2. The source of the transistor TR19 is coupled to the power supply line PW. The gate of the transistor TR17, the gate of the transistor TR18, and the gate and drain of the transistor TR19 are commonly coupled to the node N6. The current source CS4 is coupled between the node N6 and the ground line GW so as to supply the current from the node N6 to the ground line GW.

The CMFB circuit 35 performs common mode feedback. In particular, the CMFB circuit 35 outputs the CMFB signal in a manner such that the intermediate voltage between the voltage of the node N1 and the voltage of the node N2 becomes equal to the reference voltage. Hereinafter, the intermediate voltage between the voltage of the node N1 and the voltage of the node N2 will be referred to as "a common mode voltage". The CMFB circuit 35 includes resistors R1 and R2 and an operational amplifier OP. One end of the resistor R1 is coupled to the node N1, while the other end of the resistor R1 is coupled to the node N7. One end of the resistor R2 is coupled to the node N2, while the other end of the resistor R2 is coupled to the node N7. The non-inverted input terminal of the operational amplifier OP is coupled to the node N7. The voltage Vref is applied to the inverted input terminal of the operational amplifier OP. The voltage Vref is employed as a reference voltage. The operational amplifier OP compares the common mode voltage with the voltage Vref, and outputs a CMFB signal. The CMFB signal is output to each of the current sources CS2, CS3 and CS4. The magnitude of current supplied from each of the current sources CS2, CS3 and CS4 is based on the CMFB signal. The resistance value of the resistor R1 is approximately the same as the resistance value of the resistor R2. Furthermore, the resistance value of the resistor R1 and the resistance value of the resistor R2 are both large enough to render their influence on the load impedance of the differential pair 31 negligible.

The current injection circuit 36 supplies a current, the magnitude of which depends on the tap coefficient W1, to the nodes N1 and N2. The current injection circuit 36 includes transistors TR21, TR22, TR23, and TR24-1. The transistors TR21, TR22 and TR23 may be p-type MOSFETs, while the transistor TR24-1 may be an n-type MOSFET.

The source of the transistor TR21 is coupled to the power supply line PW, while the drain of the transistor TR21 is coupled to the node N1. The source of the transistor TR22 is coupled to the power supply line PW, while the drain of the transistor TR22 is coupled to the node N2. The source of the transistor TR23 is coupled to the power supply line PW. The source of the transistor TR24-1 is coupled to the ground line GW. The gate of the transistor TR21, the gate of the transistor TR22, the gate and drain of the transistor TR23, and the drain of the transistor TR24-1 are commonly coupled to the node N8.

The buffer circuit 24-1 pulls the current out of the node N1 or node N2 in accordance with the tap coefficient W1 and the signals S1 and /S1 generated based on the digital value DAT1. The buffer circuit 24-1 includes transistors TR31-1, TR32-1, TR33-1, and TR34-1, and a current source CS5-1. The transistors TR31-1, TR32-1, TR33-1, and TR34-1 may be n-type MOSFETs.

The source of the transistor TR31-1 is coupled to the ground line GW, while the source of the transistor TR32-1 is coupled to the ground line GW. The gate and drain of the transistor TR31-1, the gate of the transistor TR32-1, and the gate of the transistor TR24-1 in the current injection circuit 36 are commonly coupled to the node N9-1. The current source CS5-1 is coupled between the power supply line PW and node N9-1 so as to supply the current from the power supply line PW to the node N9-1. The magnitude of current supplied from the current source CS5-1 depends on the tap coefficient W1. The signal S1 is input to the gate of the transistor TR33-1. The drain of the transistor TR33-1 is coupled to the node N2. The signal /S1 is input to the gate of the transistor TR34-1. The drain of the transistor TR34-1 is coupled to the node N1. The drain of the transistor TR32-1, the source of the transistor TR33-1, and the source of the transistor TR34-1 are coupled to each other. The signals S1 and /S1 are differential signals each having either one of level "H" or "L", which is determined based on the digital value DAT1. For instance, when the digital value DAT1 is "0", the signal S1 is at level "L", while the signal /S1 is at level "H". When the digital value DAT1 is "1", the signal S1 is at level "H", while the signal /S1 is at level "L".

Figure 5:
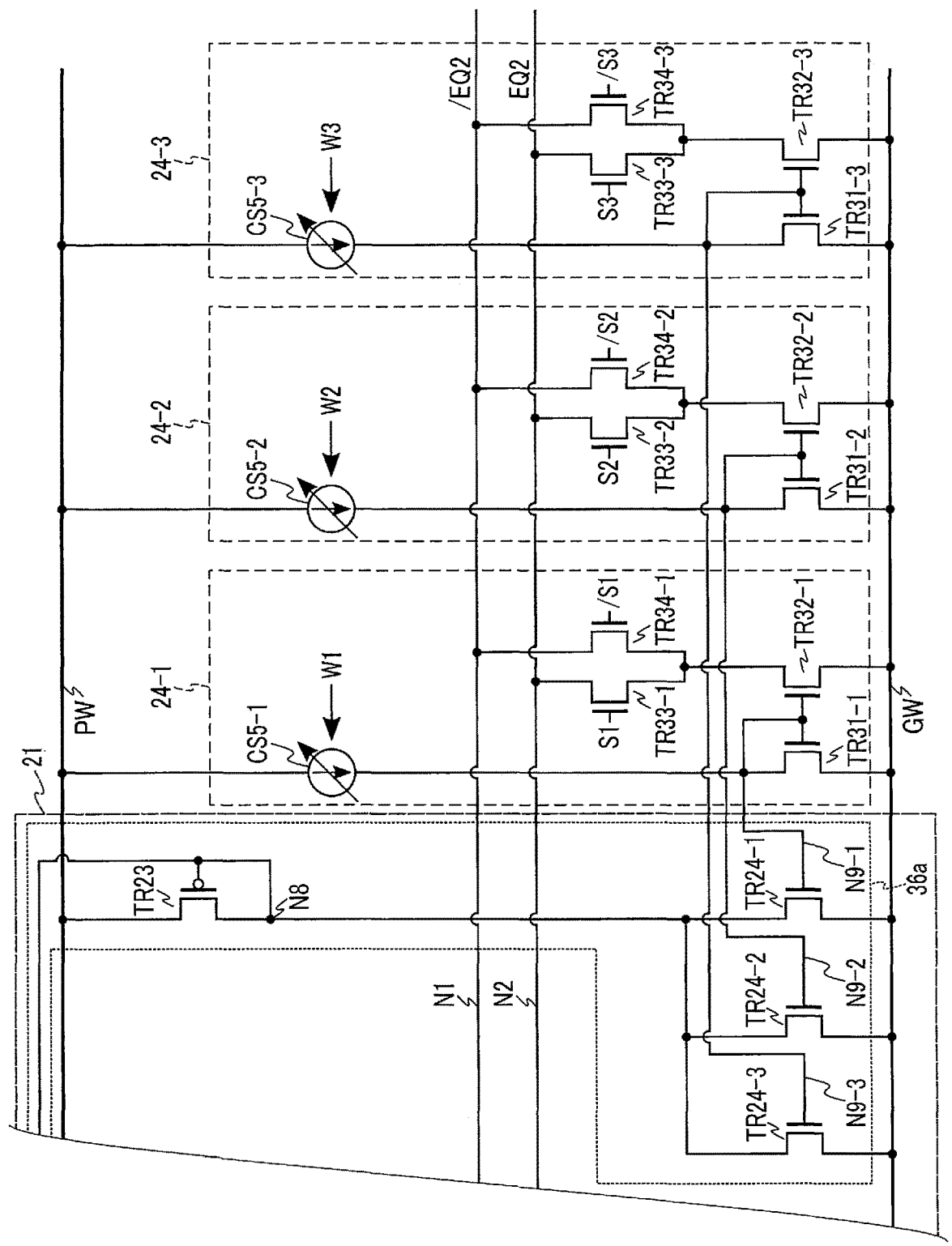
FIG. 5 is a circuit diagram showing an exemplary structure of part of the DFE circuit according to the present embodiment.

Part of the adder 21 as well as the buffer circuits 24-1, 24-2 and 24-3 will be explained with reference to FIG. 5. An exemplary circuit structure of a current injection circuit 36a of the adder 21 in the DFE circuit 12 of the semiconductor integrated circuit 10 according to the present embodiment, and the buffer circuits 24-1, 24-2 and 24-3 in this DFE circuit 12 is illustrated in FIG. 5. In this drawing, the structures corresponding to the first, second and third taps are exemplified. Each of the structures corresponding to the second tap and to the third tap are coupled in parallel to the structure corresponding to the first tap.

The current injection circuit 36a supplies to the nodes N1 and N2 the current based on the sum of the tap coefficients W1, W2 and W3. In contrast to the current injection circuit 36, the current injection circuit 36a additionally includes a transistor TR24-2 corresponding to the second tap and a transistor TR24-3 corresponding to the third tap. The transistors TR24-2 and TR24-3 may be n-type MOSFETs. The source of the transistor TR24-2 is coupled to the ground line GW. The drain of the transistor TR24-2 is coupled to the node N8. The source of the transistor TR24-3 is coupled to the ground line GW. The drain of the transistor TR24-3 is coupled to the node N8.

The buffer circuit 24-2 pulls the current from the node N1 or node N2 in accordance with the tap coefficient W2 and the signals S2 and /S2 generated based on the digital value DAT2. The buffer circuit 24-2 includes transistors TR31-2, TR32-2, TR33-2 and TR34-2, and a current source CS5-2. The transistors TR31-2, TR32-2, TR33-2 and TR34-2 may be n-type MOSFETs.

The source of the transistor TR31-2 is coupled to the ground line GW, while the source of the transistor TR32-2 is coupled to the ground line GW. The gate and drain of the transistor TR31-2, the gate of the transistor TR32-2, and the gate of the transistor TR24-2 in the current injection circuit 36a are commonly coupled to the node N9-2. The current source CS5-2 is coupled between the power supply line PW and the node N9-2 so as to supply the current from the power supply line PW to the node N9-2. The magnitude of current supplied from the current source CS5-2 depends on the tap coefficient W2. The signal S2 is input to the gate of the transistor TR33-2. The drain of the transistor TR33-2 is coupled to the node N2. The signal /S2 is input to the gate of the transistor TR34-2. The drain of the transistor TR34-2 is coupled to the node N1. The drain of the transistor TR32-2, the source of the transistor TR33-2 and the source of the transistor TR34-2 are coupled to each other. The signals S2 and /S2 are differential signals having level "H" or level "L", which is determined based on the digital value DAT2. For instance, when the digital value DAT2 is "0", the signal S2 is at level "L", while the signal /S2 is at level "H". When the digital value DAT2 is "1", the signal S2 is at level "H", the signal /S2 is at level "L".

The buffer circuit 24-3 pulls the current from the node N1 or node N2 in accordance with the tap coefficient W3 and the signals S3 and /S3 generated based on the digital value DAT3. The buffer circuit 24-3 includes transistors TR31-3, TR32-3, TR33-3 and TR34-3, and a current source CS5-3. The transistors TR31-3, TR32-3, TR33-3 and TR34-3 may be n-type MOSFETs.

The source of the transistor TR31-3 is coupled to the ground line GW, while the source of the transistor TR32-3 is coupled to the ground line GW. The gate and drain of the transistor TR31-3, the gate of the transistor TR32-3, and the gate of the transistor TR24-3 in the current injection circuit 36a are commonly coupled to the node N9-3. The current source CS5-3 is coupled between the power supply line PW and the node N9-3 so as to supply the current from the power supply line PW to the node N9-3. The magnitude of current supplied from the current source CS5-3 depends on the tap coefficient W3. The signal S3 is input to the gate of the transistor TR33-3. The drain of the transistor TR33-3 is coupled to the node N2. The signal /S3 is input to the gate of the transistor TR34-3. The drain of the transistor TR34-3 is coupled to the node N1. The drain of the transistor TR32-3, the source of the transistor TR33-3, and the source of the transistor TR34-3 are coupled to each other. The signals S3 and /S3 are differential signals having level "H" or level "L", determined based on the digital value DAT3. For instance, when the digital value DAT3 is "0", the signal S3 is at level "L", while the signal /S3 is at level "H". When the digital value DAT3 is "1", the signal S3 is at level "H", while the signal /S3 is at level "L".

In the above-described adder 21 and buffer circuits 24-1 to 24-3, which each handle differential signals, any two transistors arranged in a pair have substantially the same size. In particular, the pairs of transistors TR11 and TR12 illustrated in FIG. 4 have substantially the same size. The same applies to each of the pairs of transistors TR13 and TR15, transistors TR14 and TR16, transistors TR17 and TR18, and transistors TR21 and TR22. In addition, the pairs of transistors TR33-1 and TR34-1, transistors TR33-2 and TR34-2, transistors TR33-3 and TR34-3 illustrated in FIG. 5 each have substantially the same size.

A plurality of current mirror circuits are provided in the above described adder 21 and buffer circuits 24-1 to 24-3. For instance, the diode-connected transistor TR19 and the transistors TR17 and TR18 illustrated in FIG. 4 constitute a current mirror circuit. The diode-connected transistor TR23 and transistors TR21 and TR22 also constitute a current mirror circuit. In addition, the diode-connected transistor TR31-1 and the transistors TR24-1 and TR32-1 illustrated in FIG. 5 constitute a current mirror circuit. The diode-connected transistor TR31-2 and the transistors TR24-2 and TR32-2 constitute a current mirror circuit. The diode-connected transistor TR31-3 and the transistors TR24-3 and TR32-3 also constitute a current mirror circuit. The size of each transistor constituting these current mirror circuits can be freely determined as long as the current mirror circuits can supply a desired amount of current.

For the sake of simplicity, the relationship of some of the transistors in size is determined as follows. In FIG. 4, each of the transistors TR21 and TR22 is half the size of the transistor TR23. In FIG. 5, each of the transistors TR24-1 and TR32-1 is of approximately the same size as the transistor TR31-1. Each of the transistors TR24-2 and TR32-2 is of approximately the same size as the transistor TR31-2. Each of the transistors TR24-3 and TR32-3 is of approximately the same size as the transistor TR31-3.

[2] Operations

Figure 6:
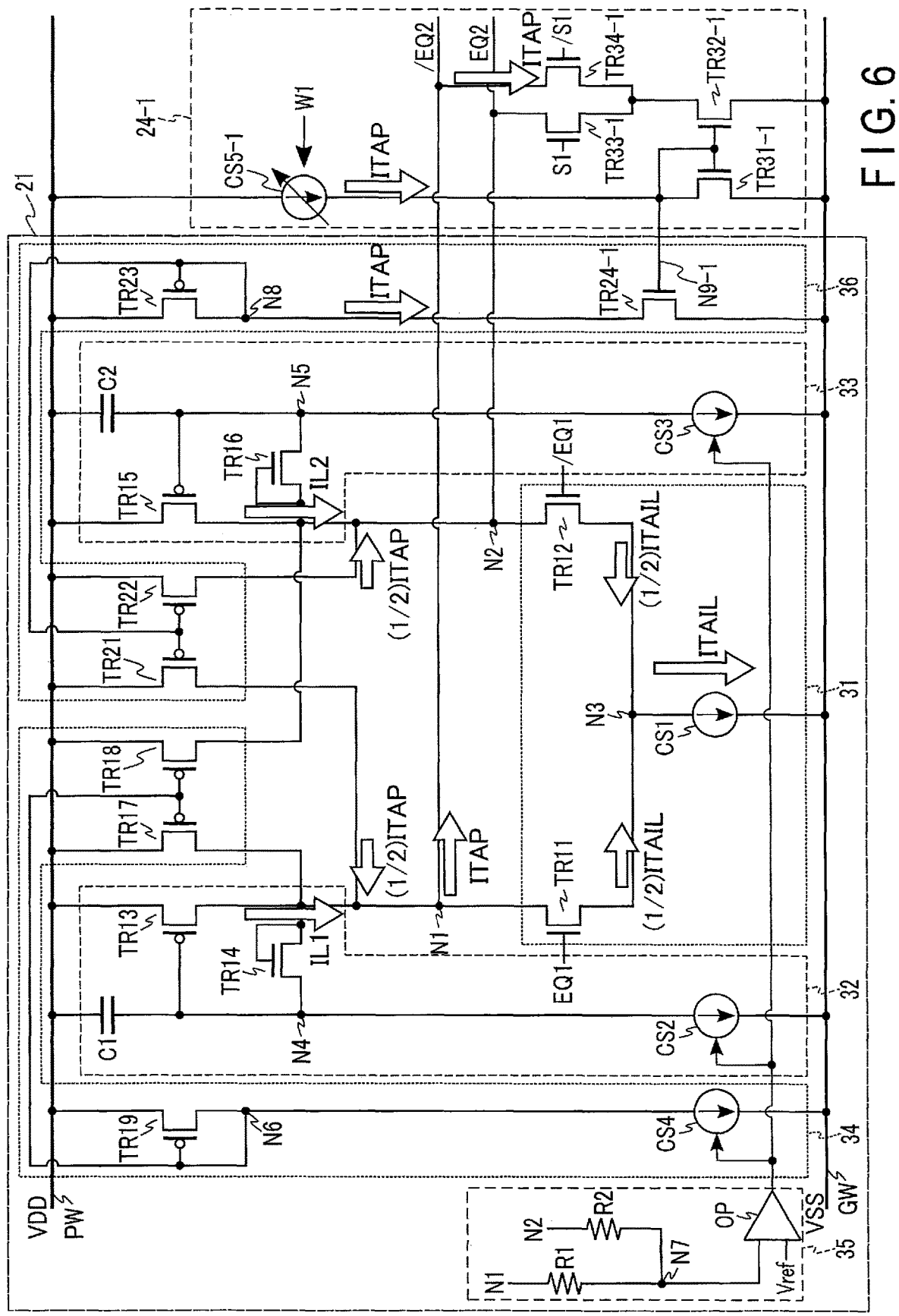
FIG. 6 is a schematic diagram for explaining an operation of the DFE circuit according to the present embodiment.

The operations of the adder 21 and buffer circuits 24 in the DFE circuit 12 of the semiconductor integrated circuit 10 according to the present embodiment will be explained in detail below with reference to FIG. 6. The arrows in FIG. 6 indicate the current flow in the DFE circuit 12 of the semiconductor integrated circuit 10 according to the present embodiment.

First, for the sake of simplicity, the conditions of the circuits are determined, and the currents that flow the circuits are defined. In this example, the DFE circuit 12 includes a single tap, or in other words only the buffer circuit 24-1. The signal EQ1 and signal /EQ1 may be the direct current voltage of the midpoint of the power supply voltage VDD and power supply voltage VSS, and the differential signal input to the adder 21 is 0V. For the tap coefficient W1 and digital value DAT1, certain values are maintained. Based on the digital value DAT1, the signal S1 is maintained at level "L", and the signal /S1 is maintained at level "H". The current source CS5-1 supplies the current based on the tap coefficient W1. The amount of current supplied by the current source CS5-1 will be referred to as "ITAP", and the amount of current supplied by the current source CS1 will be referred to as "ITAIL". Furthermore, the amount of current supplied to the node N1 by the active inductor load circuit 32 and constant current load circuit 34 will be referred to as "IL1", and the amount of current supplied to the node N2 by the active inductor load circuit 33 and constant current load circuit 34 will be referred to as "IL2".

The signal EQ1 is equal to the signal /EQ1, and with the differential signal input to the adder 21 is 0V. For this reason, the current that flows from the node N1 to the node N3 through the transistor TR11 has the same magnitude as the current that flows from the node N2 to the node N3 through the transistor TR12. The current source CS1 supplies a current of the magnitude ITAIL from the node N3 to the ground line OW, which means that the magnitude of current that passes through the transistors TR11 and TR12 is (½) ITAIL each.

The current of the magnitude ITAP supplied from the current source CS5-1 flows through the transistor TR31-1 to the ground line GW. Since the transistor TR31-1 and transistor TR32-1 constitute a current mirror, the current flowing through the transistor TR32-1 has the same magnitude as ITAP. The signal S1 of level "L" sets the transistor TR33-1 to the OFF state, while the signal /S1 of the level "H" sets the transistor TR34-1 to the ON state. In this manner, the current of the same magnitude as ITAP flows from the node N1 to the ground line GW through the transistors TR34-1 and TR32-1.

The transistor TR31-1 constitutes a current mirror also with the transistor TR24-1.

This means that the magnitude of the current that passes through the transistors TR23 and TR24-1 to the ground line GW is also the same as ITAP. The transistor TR23 constitutes a current mirror with each of the transistors TR21 and TR22, which has half the size of the transistor TR23. This means that the magnitude of the current passing through the transistor TR21 into the node N1 is (½)ITAP, and the magnitude of the current passing through the transistor TR22 into the node N2 is also (½)ITAP.

The currents supplied to and pulled from the nodes N1 and N2 by the current injection circuit 36 and the buffer circuit 24-1 will now be described. In the buffer circuit 24-1, the current of the magnitude ITAP is pulled from the node N1 through the transistors TR34-1 and TR32-1. Furthermore, in the current injection circuit 36, the current of the magnitude (½)ITAP is supplied to the node N1 through the transistor TR21. The addition of the amounts of injected and pulled currents in the buffer circuit 24-1 and current injection circuit 36 results in the current of the magnitude (½)ITAP pulled from the node N1. In the current injection circuit 36, the current of the magnitude (½)ITAP is supplied to the node N2 through the transistor TR22.

The magnitudes IL1 and IL2 are determined based on the operations of the differential pair 31, current injection circuit 36, and buffer circuit 24. In particular, IL1 is determined as (½)ITAIL+(½)ITAP, and IL2 is determined as (½)ITAIL−(½)ITAP. Furthermore, the CMFB circuit 35 outputs the CMFB signal, and thereby maintains the common mode voltage at the same level as the voltage Vref.

[3] Effects of Embodiment

The semiconductor integrated circuit 10 according to the present embodiment explained above can suppress the fluctuation of the gain of the semiconductor integrated circuit 10. The effects produced by the semiconductor integrated circuit 10 according to the present embodiment will be described in detail below.

Differential signals are constituted by a pair of signals. Each pair of signals contains a differential component expressing a differential, and a common mode component shared by the paired signals. The differential amplification circuit for outputting differential signals needs to appropriately handle the differential component and common mode component. In particular, the differential amplification circuit amplifies the differential component and maintains the common mode component at an appropriate direct current voltage. The voltage of the common mode component may be referred to as a "common mode voltage". In order to maintain the common mode component at an appropriate direct current voltage, the common mode feedback may be adopted.

In the common mode feedback, the circuits that may change the common mode voltage are controlled so that the influence of the fluctuation of the load that may change the common mode voltage can be cancelled and the common mode voltage can be maintained at a constant value. In the adder 21 illustrated in the embodiment, the CMFB signal supplied from the CMFB circuit 35 is input to the current sources CS2, CS3 and CS4. A change in the amounts of current supplied from the current sources CS2, CS3 and CS4 causes the characteristics of the active inductor load circuit 32, active inductor load circuit 33 and constant current load circuit 34 to change. In particular, the load impedance on the differential pair 31 changes. The CMFB circuit 35 can change the common mode voltage in accordance with the change of the load impedance, thereby maintains the common mode voltage at approximately the same level as the voltage Vref.

Figure 7:
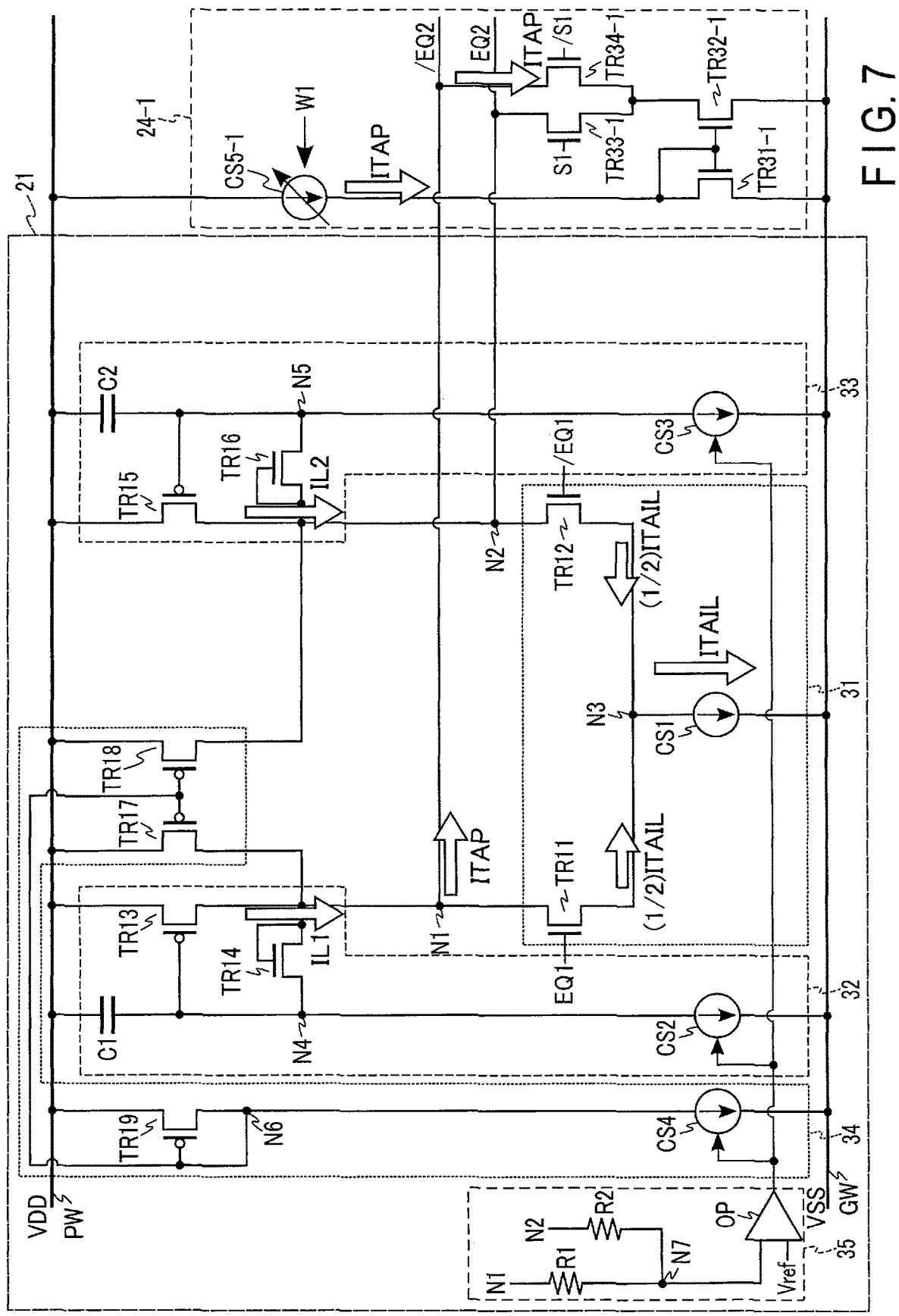
FIG. 7 is a circuit diagram showing an exemplary structure of a DFE circuit of a comparative example of the present embodiment.

FIG. 7 shows an exemplary structure of a DFE circuit in a semiconductor integrated circuit according to a comparative example of the present embodiment. Arrows in FIG. 7 indicate the current flow in the DFE circuit of the semiconductor integrated circuit of the comparative example. The DFE circuit according to the comparative example differs from the DFE circuit 12 according to the embodiment in the absence of a current injection circuit 36.

The operation of the DFE circuit according to the comparative example will be described within the same conditions as the DFE circuit 12 according to the embodiment in FIG. 6. Due to the absence of a current injection circuit 36 in the DFE circuit according to the comparative example, the current of the magnitude ITAP is pulled from the node N1 through the transistors TR34-1 and TR32-1 in the buffer circuit 24-1. As a result, the magnitude of IL1 is (½)ITAIL+ ITAP, and the magnitude of IL2 is (½)ITAIL. The common mode feedback is performed to bring the common mode voltage to the voltage Vref.

In the DFE circuit according to the comparative example, the current of the magnitude ITAP is pulled from the node N1, but the current is not pulled from the node N2 in buffer circuit 24-1. A current injection circuit 36 for injecting a current to the nodes N1 and N2 is not included in the DFE circuit of the comparative example. When the current of the magnitude ITAP is pulled from the node N1, a load that lowers the common mode voltage may be produced.

In order to cancel the fluctuation of the load that may lower the common mode voltage, the CMFB circuit 35 changes the CMFB signal to control the current sources CS2 to CS4. As a result, the load impedance is lowered, and the common mode voltage is controlled to be equal to the voltage Vref.

With the load impedance lowered, however, the gain of the adder 21 may also be lowered. With the gain of the adder 21 lowered, errors may increase at the time of restoring data.

In contrast, in the DFE circuit 12 of the semiconductor integrated circuit 10 according to the present embodiment, in addition to the buffer circuit 24-1 pulling the current of the magnitude ITAP from the node N1, the current injection circuit 36 injects the current of a magnitude based on the current of the magnitude ITAP pulled by the buffer circuit 24-1, to each of the nodes N1 and N2. As a result, in the DFE circuit 12 according to the present embodiment, the current of the magnitude (½)ITAP is pulled from the node N1, while the current of the magnitude (½)ITAP is supplied to the node N2 through the operations of the buffer circuit 24-1 and current injection circuit 36.

When the current of the magnitude (½)ITAP is pulled from the node N1 by the buffer circuit 24-1 and the current injection circuit 36, the load that may lower the common mode voltage is produced. When the current of the magnitude (½)ITAP is supplied to the node N2 by the current injection circuit 36, the load that raises the common mode voltage is produced. In other words, a load that lowers the common mode voltage and a load that raises the common mode voltage are produced at a time by the buffer circuit 24-1 and the current injection circuit 36 in the DFE circuit 12 according to the present embodiment. Thus, overall, the influence of the fluctuation of the load that may change the common mode voltage can be suppressed in the adder 21 of the DFE circuit 12 according to the present embodiment.

When the load fluctuation that may change the common mode voltage is suppressed, the fluctuation amount of the CMFB signal output by the CMFB circuit 35 can also be suppressed. That is, the fluctuation amount of the current supplied by the respective current sources CS2 to CS4 can be suppressed. In this manner, the decrease of the load impedance can be suppressed, and the decrease of the gain of the adder 21 can also be suppressed. With the gain of the adder 21 controlled, errors can also be suppressed when the data is restored.

The magnitude ITAP of the current is determined based on the tap coefficient W1. When the tap coefficient W1 takes a large value in the DFE circuit according to the comparative example, the value of ITAP also increases, which increases the load that lowers the common mode voltage. In other words, in the DFE circuit according to the comparative example, the load impedance further decreases and the gain of the adder 21 also further decreases in accordance with an increase in the tap coefficient W1.

In contrast, in the DFE circuit 12 according to the present embodiment, even if the tap coefficient W1 takes a large value which increases the value of the ITAP, a load that decreases the common mode voltage and a load that raises the common mode voltage are produced at a time. For this reason, the DFE circuit 12 according to the present embodiment suppresses the load that may change the common mode voltage even when the tap coefficient W1 takes a large value. In other words, the DFE circuit 12 according to the present embodiment suppresses the decrease of the gain of the adder 21 even when the tap coefficient W1 takes a large value. Thus, the DFE circuit 12 according to the present embodiment can suppress errors at the time of restoring the data, even when the value of the tap coefficient W1 increases.

Figure 8:
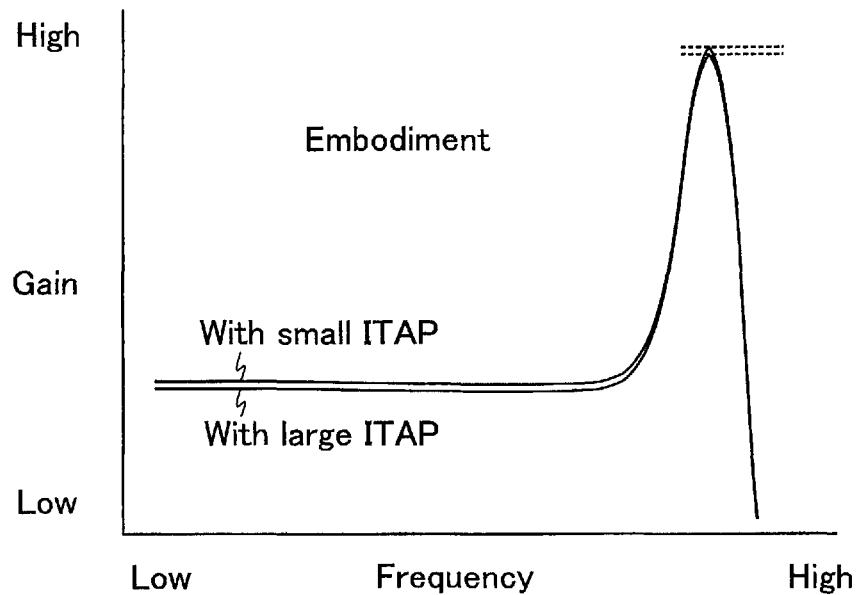
FIG. 8 is graphs indicating a relationship between frequency and gain of adders according to the present embodiment and the comparative example.
Figure 8:
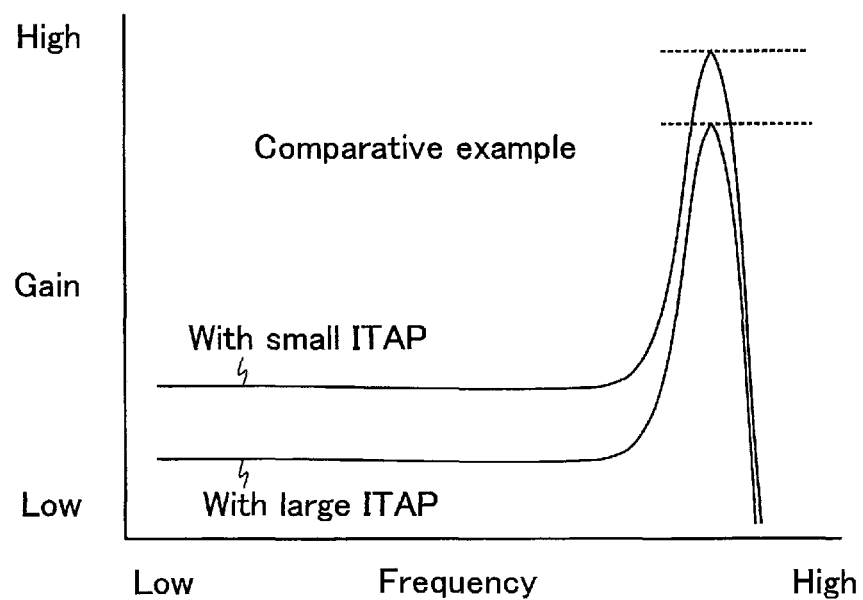

FIG. 8 shows a relationship between frequency and gain in the DFE circuit 12, according to the present embodiment, and in the DFE circuit, according to the comparative example, when the ITAP is large and when the ITAP is small. As illustrated in FIG. 8, in the DFE circuit according to the comparative example, the gain with a large ITAP is significantly smaller than the gain with a small ITAP. In contrast, in the DFE circuit 12 according to the present embodiment, the difference between the gain with a large ITAP and the gain with a small ITAP is negligible, and the fluctuation of the gain is suppressed. Thus, the DFE circuit 12 in the semiconductor integrated circuit 10 according to the present embodiment can suppress the fluctuation of the gain, irrespective of the tap coefficient.

[4] Modification Examples

In the above example of the present embodiment, the current injection circuit 36 injects the current of the magnitude (½)ITAP to the respective nodes N1 and N2, or in other words, the current of half the magnitude ITAP, which is the magnitude of the current pulled out by the buffer circuit 24-1. However, the relationship between the magnitude of current injected by the current injection circuit 36 to the nodes N1 and N2 and the magnitude of current pulled out by the buffer circuit 24-1 is not limited thereto. The magnitude of current injected to the nodes N1 and N2 by the current injection circuit 36 may be changed in accordance with the characteristics of the adder 21.

For instance, if the amount of voltage decreased at the time of pulling the current from the nodes N1 and N2 is greater than the amount of voltage raised at the time of injecting the current to the nodes N1 and N2, the amount of current injected to the nodes N1 and N2 by the current injection circuit 36 may be determined as larger than half the magnitude of current pulled by the current buffer circuit 24-1. In particular, in the example of FIG. 4, the sizes of the transistors TR21 and TR22 may be determined as larger than half the size of the transistor TR23.

Furthermore, if the amount of voltage decrease at the time of pulling the current from the nodes N1 and N2 is smaller than the amount of voltage rise at the time of injecting the current to the nodes N1 and N2, the amount of current injected to the nodes N1 and N2 by the current injection circuit 36 may be determined as smaller than half the magnitude of current pulled by the current buffer circuit 24-1. In particular, in the example of FIG. 4, the sizes of the transistors TR21 and TR22 may be determined as smaller than half the size of the transistor TR23.

In the above example of the present embodiment, the determination signals referred to by the DFE circuit 12 include the last updated determination signal to the third to last updated determination signal, or in other words, three taps. The number of taps included in the DFE circuit 12, however, is not limited thereto. The number of taps included in the DFE circuit 12 can be a freely determined natural number.

In the example of the present embodiment, the current injection circuit 36 injects the current based on the sum of all the tap coefficients. The magnitude of current injected by the current injection circuit 36 may be based on the sum of all the tap coefficients, or the sum of part of the tap coefficients, such as the first to third tap coefficients. Alternatively, the magnitude may be based on the first tap coefficient only.

In the embodiment, a specific example has been introduced to explain the relationship of the transistors in size, for the sake of simplicity. The relationship of the sizes of the transistors, however, is not limited to this example. For instance, the sizes of the transistors TR21, TR22, TR23, TR24-1, TR31-1 and TR32-1 may be suitably changed as long as a desired size of current can be supplied. For example, the transistor TR31-1 may be smaller than the transistor TR32-1. If the transistor TR31-1 is changed to one tenth of the size of the transistor TR32-1, the current supplied by the current source CS5-1 may be changed to (1/10)ITAP. The size of the transistor TR24-1 is approximately the same as the size of the transistor TR31-1. The transistor TR23 is changed to one fifth of the size of the transistor TR21 or TR22. With such a configuration, the transistor TR32-1 supplies the current of the magnitude ITAP in the same manner as in the embodiment so that each of the transistors TR21 and TR22 can supply the current of the magnitude (½)ITAP.

In the embodiment, the CMFB circuit 35 includes the resistors R1 and R2 and operational amplifier OP, but the structure of the CMFB circuit 35 is not limited thereto. For instance, the common mode voltage may be obtained without resistors arranged between the nodes N1 and N2, or a CMFB signal may be output without the use of an operational amplifier.

Figure 9:
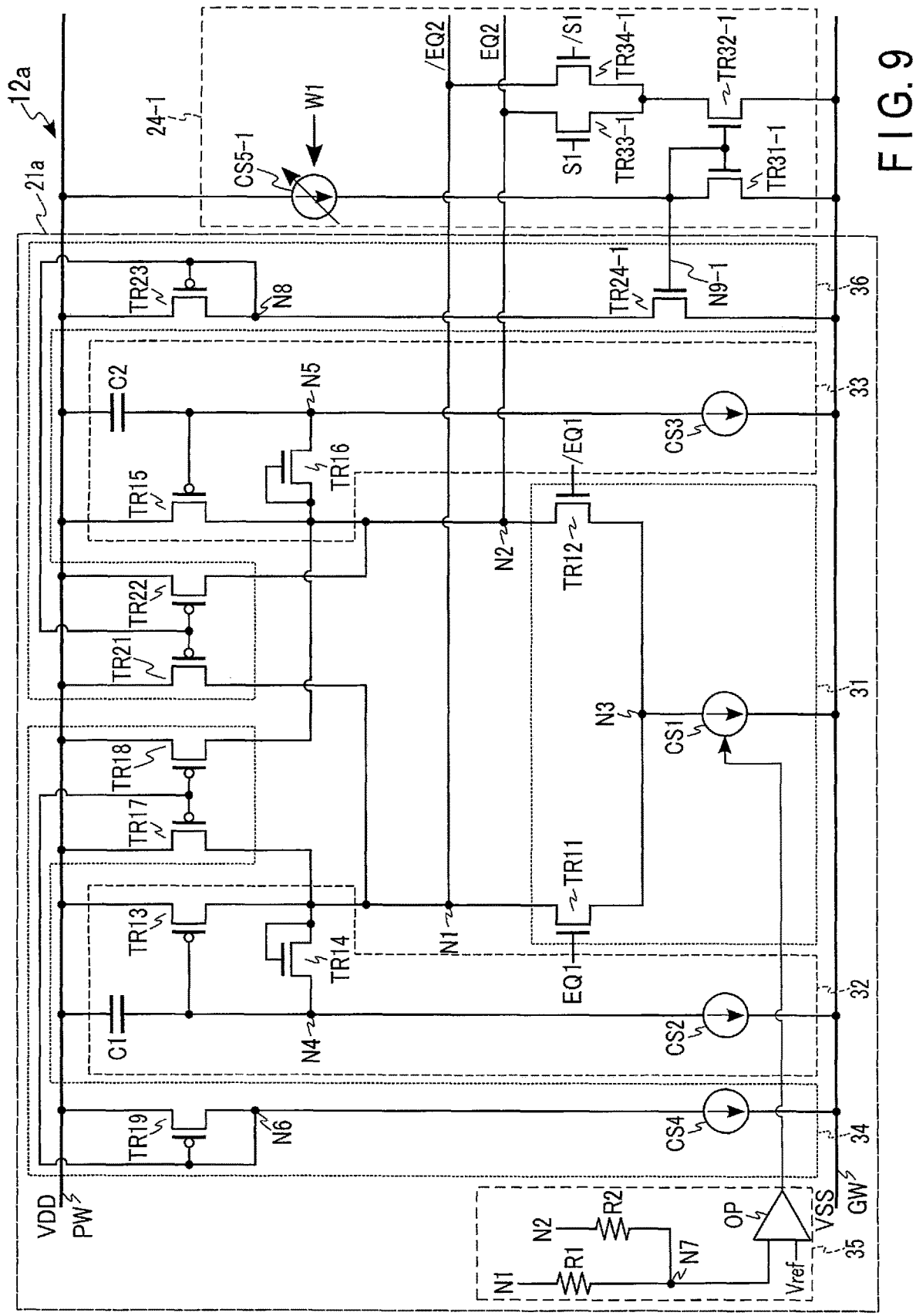
FIG. 9 is a circuit diagram showing an exemplary structure of a DFE circuit in a first modification example of the embodiment.

In the embodiment, the CMFB signal is input to the current sources CS2, CS3 and CS4, but the structure for the common mode feedback is not limited thereto. FIG. 9 shows an exemplary structure of part of a DFE circuit 12a according to a first modification example of the present embodiment. In contrast to the embodiment, in an adder 21a in the DFE circuit 12a according to the first modification example, a CMFB signal is input to the current source CS1, but not to the current source CS2, CS3 or CS4, as illustrated in FIG. 9. When the CMFB signal is input to the current source CS1, the amplification rates of the transistors TR11 and TR12 tend to vary in accordance with a change in the amount of current supplied by the current source CS1 for the purpose of maintaining the common mode voltage. With the current injection circuit 36 suppressing the load that may fluctuate the common mode voltage, the fluctuation of the gain can be suppressed in the DFE circuit 12a according to the first modification example in the same manner as the DFE circuit 12 according to the embodiment.

Figure 10:
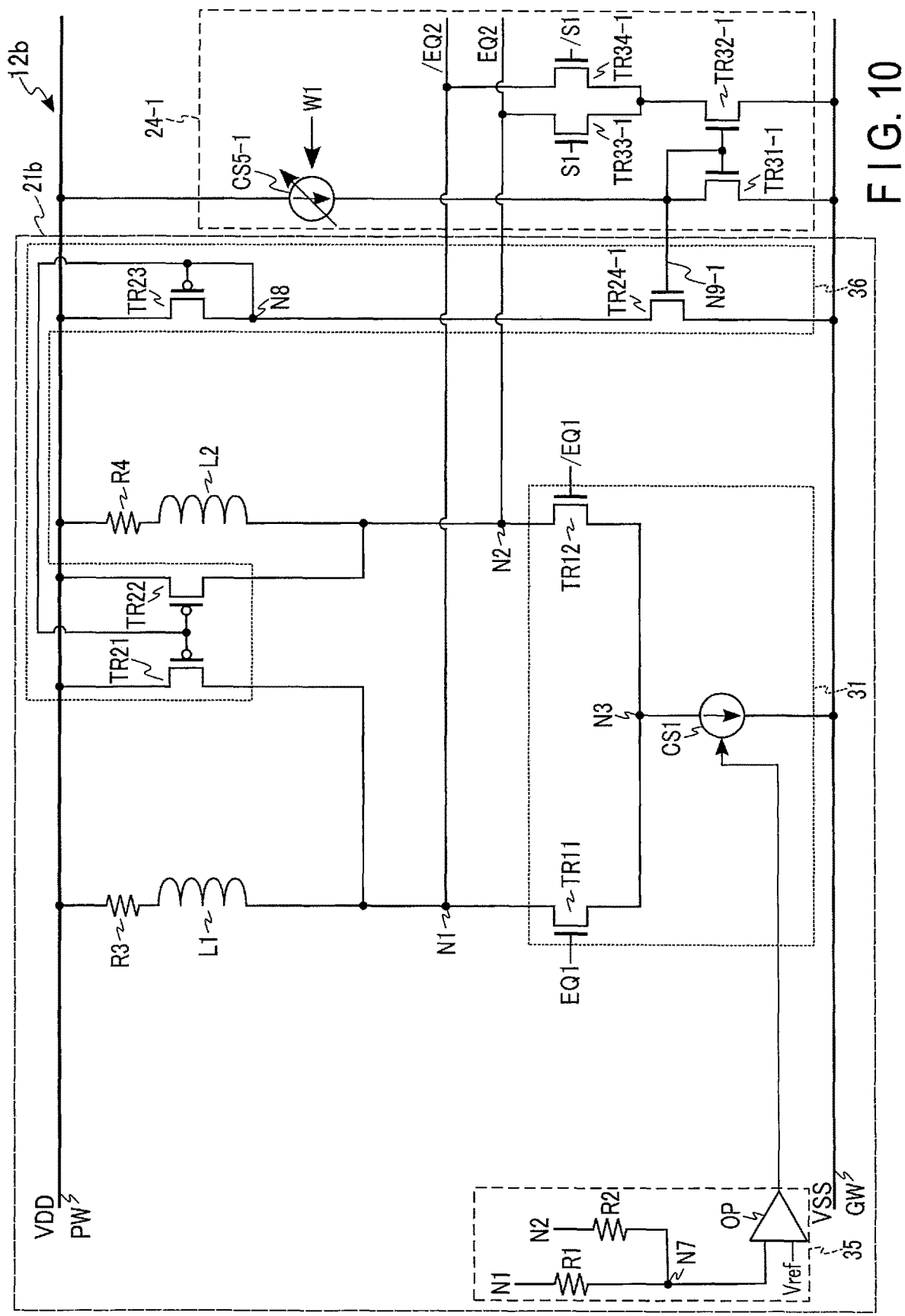
FIG. 10 is a circuit diagram showing an exemplary structure of a DFE circuit in a second modification example of the embodiment.

In the embodiment and modification examples, the active inductor load circuits 32 and 33 and the constant current load circuit 34 operate as loads of the differential pair 31. The loads of the differential pair 31 are not limited thereto. FIG. 10 shows a partial structure of the DFE circuit 12b according to a second modification example of the present embodiment. As illustrated in FIG. 10, in the adder 21b of the DFE circuit 12b, the active inductor load circuits 32 and 33 of the first modification example are replaced with L1 and resistor R3 and the inductor L2 and resistor R4, respectively, and the constant current load circuit 34 is omitted. In particular, in the DFE circuit 12b according to the second modification example, the inductor L1 and resistor R3 are coupled in series and arranged between the node N1 and power supply line PW, and the inductor L2 and resistor R4 are coupled in series and arranged between the node N2 and power supply line PW. In this DFE circuit 12b, the inductor L1 and resistor R3, as well as the inductor L2 and resistor R4, function as a load of the differential pair 31. With such a structure, the DFE circuit 12b according to the second modification example can suppress the fluctuation of the gain in the same manner as the DFE circuit 12 of the embodiment.

Figure 11:
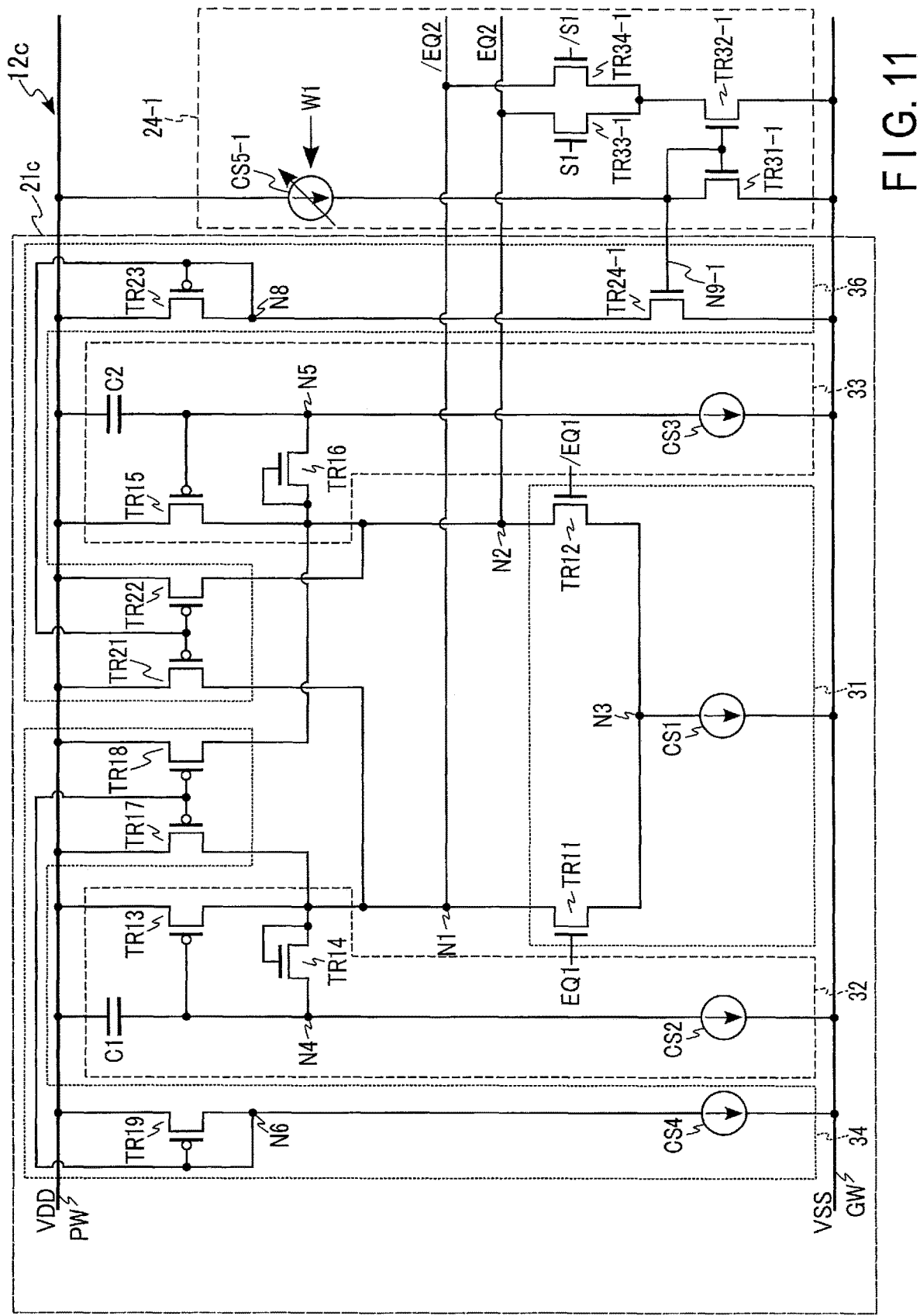
FIG. 11 is a circuit diagram showing an exemplary structure of a DFE circuit in a third modification example of the embodiment.

In the explanation of the embodiment, the DFE circuit 12 includes the CMFB circuit 35, but the structure of the DFE circuit is not limited thereto. FIG. 11 shows an exemplary structure of an adder 21c in a DFE circuit 12c according to a third modification example of the embodiment. In comparison with the embodiment, the DFE circuit 12c according to the third modification example omits the CMFB circuit 35, as illustrated in FIG. 11. The common mode voltage may fluctuate to a larger degree in a differential circuit without a CMFB circuit 35 than in a differential circuit with a CMFB circuit 35. With the current injection circuit 36 of the present embodiment arranged, however, the DFE circuit 12c according to the third modification example can still suppress the fluctuation of the gain in the same manner as the DFE circuit 12 of the present embodiment.

Figure 12:
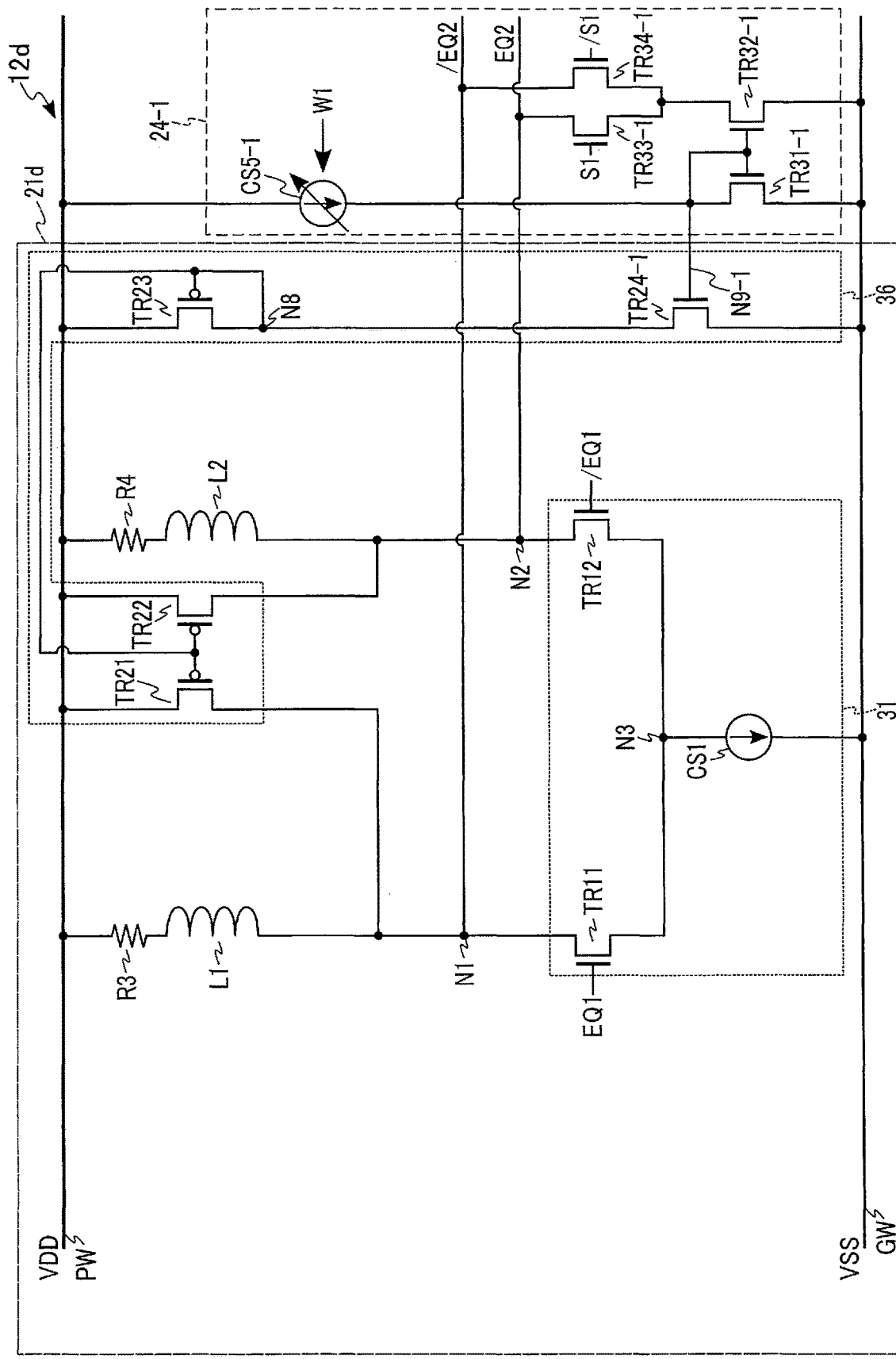
FIG. 12 is a circuit diagram showing an exemplary structure of a DFE circuit in a fourth modification example of the embodiment.

FIG. 12 shows an exemplary structure of an adder 21d in a DFE circuit 12d according to a fourth modification example of the present embodiment. In comparison to the second modification example, the DFE circuit 12d according to the fourth modification example omits the CMFB circuit 35, as illustrated in FIG. 12. With such a structure, the DFE circuit 12d according to the fourth modification example can suppress the fluctuation of the gain, in the same manner as the DFE circuit 12 according to the embodiment.

In the explanation of the embodiment, the active inductor load circuit 32 includes the capacitor C1 and transistor TR14, and the active inductor load circuit 33 includes the capacitor C2 and transistor TR16. The structure of the active inductor load circuit, however, is not limited thereto. FIG. 13 shows the structure of an active inductor load circuit 32a according to the fifth modification example. In the structure of the active inductor load circuit 32a according to the fifth modification example, the capacitor C1 in the active inductor load circuit 32 of the embodiment is replaced with a transistor TR40, and the transistor TR14 is replaced with a resistor R5. The transistor TR40 may be a p-type MOSFET. The source and drain of the transistor TR40 are coupled to the power supply line PW, while its gate is coupled to the node N4. One end of the resistor R5 is coupled to the node N1, while the other end of the resistor R5 is coupled to the node N4. In this manner, the capacitors C1 and C2 in the active inductor load circuits 32 and 33, respectively, of the embodiment may be constituted by MOSFETs. Furthermore, the transistors TR14 and TR16 in the active inductor load circuits 32 and 33 of the embodiment have characteristics similar to those of resistors. For this reason, the transistors TR14 and TR16 in the active inductor load circuits 32 and 33 of the embodiment may be constituted by resistors.

Throughout the specification, a circuit "pulling a current" from a node represents a current flowing from the node to the ground line via the circuit. A circuit "injecting a current" to a node represents a current flowing from the power supply line to the node via the circuit.

Throughout the specification, a signal of the level "H" is defined as a signal that, when input to the gate of an n-type MOSFET, turns the n-type MOSFET to the ON state, and when input to the gate of a p-type MOSFET, turns the p-type MOSFET to the OFF state. On the other hand, a signal of the level "L" is defined as a signal that, when input to the gate of an n-type MOSFET, turns the n-type MOSFET to the OFF state, and when input to the gate of a p-type MOSFET, turns the p-type MOSFET to the ON state.

Throughout the specification, the "size of a transistor" denotes the area of a gate electrode (L×W) obtained from the gate length L and gate width W of the gate electrode of the transistor. The relationship of the size of transistors is indicated by the relationship of the areas of the gate electrodes of the transistors. For instance, when the sizes of two transistors having the same gate length and different gate widths are compared, the transistor having a larger gate width can be regarded as being larger in size than the transistor having a smaller gate width.

Throughout the specification, the source and drain of a transistor may be referred to as "ends of the transistor". For instance, the first end of the transistor may be a drain or source, and the second end of the transistor may be a source or drain.

Throughout the specification, "coupling" represents establishment of an electrical connection, which may or may not include another element interposed between. Furthermore, "electrical coupling" may have an insulator interposed between as long as the coupled elements can operate in the same manner as directly coupled elements.

Throughout the specification, "diode-connected transistors" represent transistors whose drain and gate are coupled to each other.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:
1. A semiconductor integrated circuit comprising:
a first power supply line to which a first voltage is applied;
a second power supply line to which a second voltage is applied, the second voltage being lower than the first voltage;
a first node arranged between the first power supply line and the second power supply line and configured to output, based on first differential signals input to the semiconductor integrated circuit, one of second differential signals;

a second node arranged between the first power supply line and the second power supply line and configured to output the other of the second differential signals;

a first circuit comprising a first transistor and a second transistor, the first transistor including a first end coupled to the first node and a gate to which a first control signal is input, the second transistor including a first end coupled to the second node and a gate to which an inverted signal of the first control signal is input, a second end of the first transistor and a second end of the second transistor both being electrically coupled to the second power supply line, the first circuit being configured to supply a first current to the second power supply line, from the first node via the first transistor or from the second node via the second transistor; and a second circuit comprising a third transistor and a fourth transistor, the third transistor including a first end coupled to the first node and a second end coupled to the first power supply line, the fourth transistor including a first end coupled to the second node and a second end coupled to the first power supply line, the second circuit being configured to supply a second current from the first power supply line to the first node via the third transistor based on a magnitude of the first current, and to supply a third current from the first power supply line to the second node via the fourth transistor based on the magnitude of the first current.

2. The semiconductor integrated circuit according to claim 1, wherein
the first circuit further comprises a fifth transistor, a sixth transistor, and a first current source,
the fifth transistor being arranged between the second power supply line and both of the second ends of the first transistor and the second transistor, and including a gate coupled to a third node,
the sixth transistor including a first end and a gate both being coupled to the third node, and a second end coupled to the second power supply line,
the first current source being configured to supply a fourth current from the first power supply line to the third node,
the second circuit further comprises a seventh transistor and an eighth transistor,
the seventh transistor including a first end and a gate both being coupled to a fourth node, and a second end coupled to the first power supply line,
the eighth transistor including a first end coupled to the fourth node, a second end coupled to the second power supply line, a gate coupled to the third node, and wherein
a gate of the third transistor and a gate of the fourth transistor are both coupled to the fourth node.

3. The semiconductor integrated circuit according to claim 2, further comprising a ninth transistor, a tenth transistor, a second current source, a third circuit, and a fourth circuit; wherein
the ninth transistor includes a first end coupled to the first node, a second end coupled to a fifth node, and a gate to which one of the first differential signals is input,
the tenth transistor includes a first end coupled to the second node, a second end coupled to the fifth node, and a gate to which the other of the first differential signals is input, the second current source is configured to supply a fifth current from the fifth node to the second power supply line,
the third circuit is configured to serve as a load of the ninth transistor,
the fourth circuit is configured to serve as a load of the tenth transistor, and
the second differential signals are differential amplification signals based on the first differential signals.

4. The semiconductor integrated circuit according to claim 3, further comprising an eleventh transistor, a twelfth transistor, a thirteenth transistor, and a third current source; wherein
the eleventh transistor includes a first end coupled to the first node, a second end coupled to the first power supply line, a gate coupled to a sixth node,
the twelfth transistor includes a first end coupled to the second node, a second end coupled to the first power supply line, and a gate coupled to the sixth node,
the thirteenth transistor includes a first end and a gate both coupled to the sixth node, and a second end coupled to the second power supply line, and
the third current source is configured to supply a sixth current from the sixth node to the second power supply line.

5. The semiconductor integrated circuit according to claim 3, wherein
the third circuit comprises an eleventh transistor, a first capacitor, a twelfth transistor, and a third current source,
the eleventh transistor including a first end coupled to the first node, a second end coupled to the first power supply line, and a gate coupled to a sixth node,
the first capacitor including one electrode coupled to the first power supply line, and the other electrode coupled to the sixth node,
the twelfth transistor including a first end and a gate both coupled to the first node, and a second end coupled to the sixth node,
the third current source being configured to supply a sixth current from the sixth node to the second power supply line, and
the fourth circuit comprises a thirteenth transistor, a second capacitor, a fourteenth transistor, and a fourth current source,
the thirteenth transistor including a first end coupled to the second node, a second end coupled to the first power supply line, a gate coupled to a seventh node,
the second capacitor including one electrode coupled to the first power supply line, and the other electrode coupled to the seventh node,
the fourteenth transistor including a first end and a gate both coupled to the second node, and a second end coupled to the seventh node, and
the fourth current source being configured to supply a seventh current from the seventh node to the second power supply line.

6. The semiconductor integrated circuit according to claim 5, further comprising a fifth circuit, wherein
the fifth circuit is configured to control the fourth current source and the fifth current source such that a voltage between a voltage of the first node and a voltage of the second node becomes equal to a reference voltage.

7. The semiconductor integrated circuit according to claim 3, further comprising a fifth circuit, wherein
the fifth circuit is configured to control the third circuit and the fourth circuit such that a voltage between a voltage of the first node and a voltage of the second node becomes equal to a reference voltage.

8. The semiconductor integrated circuit according to claim 3, further comprising a fifth circuit, wherein
the fifth circuit is configured to control the second current source such that a voltage between a voltage of the first node and a voltage of the second node becomes equal to a reference voltage.

9. The semiconductor integrated circuit according to claim 2, wherein;
each of the third transistor and the fourth transistor is smaller than the seventh transistor in a size thereof.

10. The semiconductor integrated circuit according to claim 2, further comprising a ninth transistor, a tenth transistor, an eleventh transistor, a twelfth transistor, a second current source, and a third circuit, wherein
the ninth transistor includes a first end coupled to the first node, and a gate to which a second control signal is input,
the tenth transistor includes a first end coupled to the second node, and a gate to which an inverted signal of the second control signal is input,
the eleventh transistor is coupled between the second power supply line and both of the second ends of the ninth transistor and the tenth transistor, and includes a gate coupled to a fifth node,
the twelfth transistor includes a first end and a gate both coupled to the fifth node, and a second end coupled to the second power supply line,
the second current source is configured to supply a fifth current from the first power supply line to the third node,
the third circuit is configured to supply a sixth current from the first node to the second power supply line via the ninth transistor or from the second node to the second power supply line via the tenth transistor, and wherein
the second circuit further comprises a thirteenth transistor, the thirteenth transistor including a first end coupled to the fourth node, a second end coupled to the second power supply line, a gate coupled to the fifth node.

11. The semiconductor integrated circuit according to claim 1, wherein
the third transistor has the same size as that of the fourth transistor.

12. The semiconductor integrated circuit according to claim 11, wherein
the second current is smaller than the first current in an amount thereof.

13. The semiconductor integrated circuit according to claim 1, further comprising a third circuit,
wherein the third circuit is configured to perform control such that a voltage between a voltage of the first node and a voltage of the second node becomes equal to a reference voltage.

14. A receiver comprising:
a continuous-time linear equalizer; and
the semiconductor integrated circuit according to claim 1 configured to receive a signal from the continuous-time linear equalizer,
wherein the continuous-time linear equalizer is configured to receive third differential signals from outside of the receiver, and transmits, as the first differential signals, signals obtained by amplifying a high-frequency band of the third differential signals to the semiconductor integrated circuit, and the semiconductor integrated circuit outputs the second differential signals obtained by amplifying the first differential signals.

15. The receiver according to claim 14, wherein
the first circuit in the semiconductor integrated circuit further comprises a fifth transistor, a sixth transistor, and a first current source,
the fifth transistor being arranged between the second power supply line and both of the second ends of the first transistor and the second transistor, and including a gate coupled to a third node,
the sixth transistor including a first end and a gate both being coupled to the third node, and a second end coupled to the second power supply line,
the first current source being configured to supply a fourth current from the first power supply line to the third node,
the second circuit in the semiconductor integrated circuit further comprises a seventh transistor and an eighth transistor,
the seventh transistor including a first end and a gate both being coupled to a fourth node, and a second end coupled to the first power supply line,
the eighth transistor including a first end coupled to the fourth node, a second end coupled to the second power supply line, a gate coupled to the third node, and wherein
a gate of the third transistor and a gate of the fourth transistor are both coupled to the fourth node.

16. The receiver according to claim 15, wherein the semiconductor integrated circuit further comprises a ninth transistor, a tenth transistor, a second current source, a third circuit, and a fourth circuit,
the ninth transistor includes a first end coupled to the first node, a second end coupled to a fifth node, and a gate to which one of the first differential signals is input,
the tenth transistor includes a first end coupled to the second node, a second end coupled to the fifth node, and a gate to which the other of the first differential signals is input,
the second current source is configured to supply a fifth current from the fifth node to the second power supply line,
the third circuit is configured to serve as a load of the ninth transistor,
the fourth circuit is configured to serve as a load of the tenth transistor, and
the second differential signals are differential amplification signals based on the first differential signals.

17. The receiver according to claim 15, wherein;
each of the third transistor and the fourth transistor is smaller than the seventh transistor in a size thereof.

18. The receiver according to claim 14, wherein
the third transistor has the same size as that of the fourth transistor.

19. The receiver according to claim 18, wherein
the second current is smaller than the first current in an amount thereof.

20. The receiver according to claim 14, wherein the semiconductor integrated circuit further comprises a third circuit,
wherein the third circuit is configured to perform control such that a voltage between a voltage of the first node and a voltage of the second node becomes equal to a reference voltage.

* * * * *